US012477663B2

United States Patent
Kagohashi et al.

(10) Patent No.: US 12,477,663 B2
(45) Date of Patent: Nov. 18, 2025

(54) PRINTED WIRING BOARD (71) Applicant: IBIDEN CO., LTD., Gifu (JP)

(72) Inventors: Susumu Kagohashi, Ogaki (JP); Jun Sakai, Ogaki (JP); Kyohei Yoshikawa, Ogaki (JP); Takuya Inishi, Ibi-gun (JP)

(73) Assignee: IBIDEN CO., LTD., Ogaki (JP)

( * ) Notice: Subject to any disclaimer, the term of this patent is extended or adjusted under 35 U.S.C. 154(b) by 240 days.

(21) Appl. No.: 18/475,288

(22) Filed: Sep. 27, 2023

(65) Prior Publication Data
US 2024/0107685 A1 Mar. 28, 2024

(30) Foreign Application Priority Data

Sep. 28, 2022 (JP) .................. 2022-154724
May 24, 2023 (JP) .................. 2023-085287
Jul. 28, 2023 (JP) .................. 2023-122929

(51) Int. Cl.
*H05K 1/11* (2006.01)
*H05K 1/03* (2006.01)
*H05K 3/00* (2006.01)
*H05K 3/06* (2006.01)
*H05K 3/16* (2006.01)
*H05K 3/46* (2006.01)

(52) U.S. Cl.
CPC ......... *H05K 3/4688* (2013.01); *H05K 1/0306* (2013.01); *H05K 1/0313* (2013.01); *H05K 1/116* (2013.01); *H05K 3/0035* (2013.01); *H05K 3/062* (2013.01); *H05K 3/16* (2013.01); *H05K 3/4608* (2013.01); *H05K 2201/0209* (2013.01); *H05K 2201/0212* (2013.01); *H05K 2201/0338* (2013.01); *H05K 2203/0369* (2013.01)

(58) Field of Classification Search
CPC ...... H05K 1/115; H05K 1/116; H05K 3/0035; H05K 2201/0338
See application file for complete search history.

(56) References Cited

U.S. PATENT DOCUMENTS

2022/0071016 A1 3/2022 Hwang et al.

FOREIGN PATENT DOCUMENTS

JP 2000-124602 A 4/2000

*Primary Examiner* — Jeremy C Norris
(74) *Attorney, Agent, or Firm* — Finnegan, Henderson, Farabow, Garrett & Dunner, LLP (57) ABSTRACT A printed wiring board includes a first conductor layer, a resin insulating layer having an opening, a second conductor layer including a seed layer and an electrolytic plating layer formed on the seed layer, and a via conductor including the seed layer and the electrolytic plating layer and connecting the first conductor and second conductor layers. The seed layer has a first portion on the surface of the insulating layer, a second portion on an inner wall surface in the opening of the insulating layer, and a third portion on a portion of the first conductor layer exposed by the opening of the insulating layer such that the first portion is thicker than the second portion and the third portion, the second portion has a first film and a second film electrically connected to the first film, and a portion of the first film is formed on the second film.

20 Claims, 7 Drawing Sheets

PRINTED WIRING BOARD

CROSS-REFERENCE TO RELATED APPLICATIONS

The present application is based upon and claims the benefit of priority to Japanese Patent Application No. 2022-154724, filed Sep. 28, 2022, Japanese Patent Application No. 2023-085287, filed May 24, 2023, and Japanese Patent Application No. 2023-122929, filed Jul. 28, 2023. The entire contents of these applications are incorporated herein by reference.

BACKGROUND OF THE INVENTION

Field of the Invention

The present invention relates to a printed wiring board.

Description of Background Art

Japanese Patent Application Laid-Open Publication No. 2000-124602 describes a printed wiring board having a resin substrate, a resin insulating layer formed on the resin substrate, and a conductor circuit. The entire contents of this publication are incorporated herein by reference.

SUMMARY OF THE INVENTION

According to one aspect of the present invention, a printed wiring board includes a first conductor layer, a resin insulating layer formed on the first conductor layer having an opening, a second conductor layer formed on a surface of the resin insulating layer and including a seed layer and an electrolytic plating layer formed on the seed layer, and a via conductor formed in the opening of the resin insulating layer and including the seed layer and the electrolytic plating layer formed on the seed layer such that the via conductor is connecting the first conductor layer and the second conductor layer. The seed layer has a first portion formed on the surface of the resin insulating layer, a second portion formed on an inner wall surface in the opening of the resin insulating layer, and a third portion formed on a portion of the first conductor layer exposed by the opening of the resin insulating layer such that a thickness of the first portion is greater than a thickness of the second portion and a thickness of the third portion, that the second portion has a first film and a second film electrically connected to the first film and that a portion of the first film is formed on the second film.

According to another aspect of the present invention, a method for manufacturing a printed wiring board includes forming an opening in a resin insulating layer formed on a first conductor layer such that the opening exposes a portion of the first conductor layer, forming, on a surface of the resin insulating layer, a second conductor layer including a seed layer and an electrolytic plating layer formed on the seed layer, and forming, in the opening of the resin insulating layer, a via conductor including the seed layer and the electrolytic plating layer formed on the seed layer such that the via conductor is connecting the first conductor layer and the second conductor layer. The seed layer has a first portion formed on the surface of the resin insulating layer, a second portion formed on an inner wall surface in the opening of the resin insulating layer, and a third portion formed on a portion of the first conductor layer exposed by the opening of the resin insulating layer such that a thickness of the first portion is greater than a thickness of the second portion and a thickness of the third portion, the resin insulating layer includes resin and inorganic particles such that the inorganic particles including first inorganic particles forming the inner wall surface and second inorganic particles embedded in the resin insulating layer and that the first inorganic particles have shapes that are different from shapes of the second inorganic particles, the forming of the opening includes forming a group of the second inorganic particles having protruding portions protruding from the inner wall surface in the opening of the resin insulating layer, and removing the protruding portions in the group of the second inorganic particles such that the first inorganic particles having flat parts are formed on the inner wall surface of the resin insulating layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Embodiments will now be described with reference to the accompanying drawings, wherein like reference numerals designate corresponding or identical elements throughout the various drawings.

Embodiment

Figure 1:
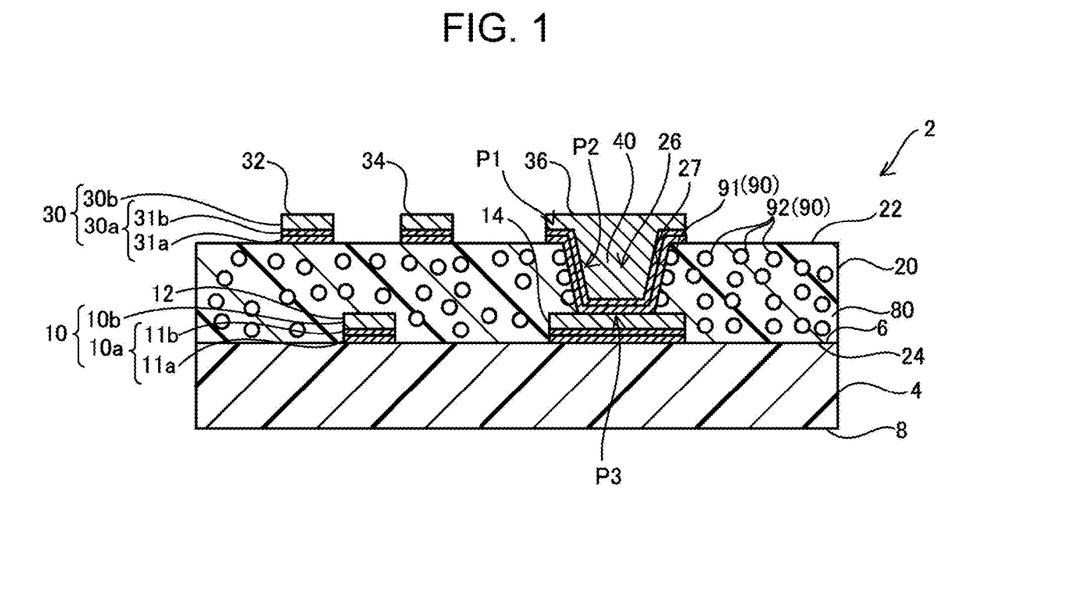
FIG. 1 is a cross-sectional view schematically illustrating a printed wiring board according to an embodiment of the present invention.
Figure 2:
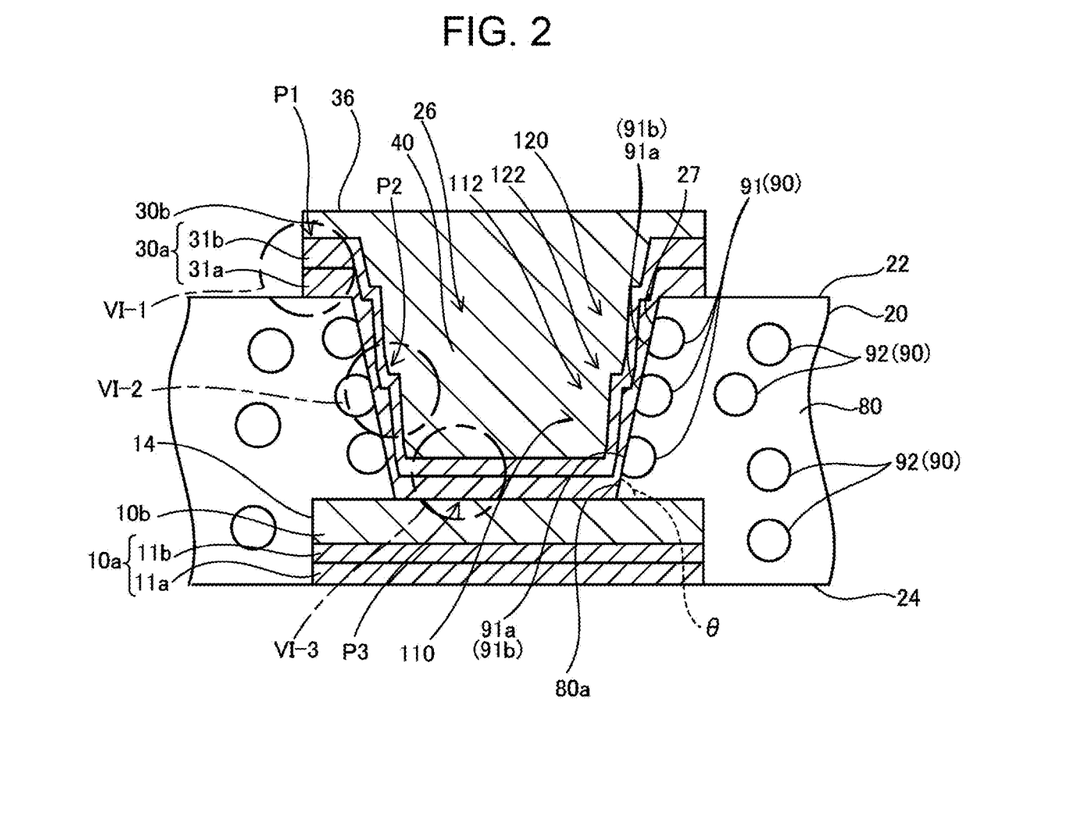
FIG. 2 is an enlarged cross-sectional view schematically illustrating a part of a printed wiring board according to an embodiment of the present invention.

FIG. 1 is a cross-sectional view illustrating a printed wiring board 2 according to an embodiment of the present invention. FIG. 2 is an enlarged cross-sectional view illustrating a part of the printed wiring board 2 of the embodiment. As illustrated in FIG. 1, the printed wiring board 2 includes an insulating layer 4, a first conductor layer 10, a resin insulating layer 20, a second conductor layer 30, and a via conductor 40.

The insulating layer 4 is formed using a resin. The insulating layer 4 may contain inorganic particles such as silica particles. The insulating layer 4 may contain a reinforcing material such as a glass cloth. The insulating layer 4 has a third surface 6 and a fourth surface 8 on the opposite side with respect to the third surface 6.

The first conductor layer 10 is formed on the third surface 6 of the insulating layer 4. The first conductor layer 10 includes a signal wiring 12 and a pad 14. Although not illustrated in the drawing, the first conductor layer 10 also includes conductor circuits other than the signal wiring 12 and the pad 14. The first conductor layer 10 is mainly formed of copper. The first conductor layer 10 is formed of a seed layer (10a) on the insulating layer 4 and an electrolytic plating layer (10b) on the seed layer (10a). The seed layer (10a) is formed by sputtering. The seed layer (10a) is formed of a first layer (11a) on the third surface 6 and a second layer (11b) on the first layer (11a). The first layer (11a) is in contact with the insulating layer 4. The second layer (11b) is not essential.

The first layer (11a) is formed of an alloy containing copper, aluminum, and a specific metal. The first layer (11a) is formed of a copper alloy. The alloy preferably contains one type of specific metal, or two types of specific metals, or three types of specific metals. The aluminum content in the alloy is 1.0 at % or more and 15.0 at % or less. An example of a specific metal is silicon. The content of the specific metal in the alloy is 0.5 at % or more and 10.0 at % or less. The first layer (11a) may contain impurities. Examples of the impurities are oxygen and carbon. The first layer (11a) can contain oxygen or carbon. The first layer (11a) can contain oxygen and carbon. In the embodiment, the alloy further contains carbon. The carbon content in the alloy is 50 ppm or less. The alloy further contains oxygen. The oxygen content in the alloy is 100 ppm or less. The values of the contents of the elements described above are examples. Among the elements that form the first layer (11a), the copper content is the largest. The aluminum content is the next largest. The content of the specific metal is less than the aluminum content. Therefore, copper is a primary metal, aluminum is a first secondary metal, and the specific metal is a second secondary metal. The content of the impurities is smaller than the content of the specific metal.

The second layer (11b) is formed of copper. A content of copper forming the second layer (11b) is 99.9 at % or more. The copper content in the second layer (11b) is preferably 99.95 at % or more. The electrolytic plating layer (10b) is formed of copper. A content of copper forming the electrolytic plating layer (10b) is 99.9 at % or more. The copper content in the electrolytic plating layer (10b) is preferably 99.95 at % or more.

The resin insulating layer 20 is formed on the third surface 6 of the insulating layer 4 and on the first conductor layer 10. The resin insulating layer 20 has a first surface 22 and a second surface 24 on the opposite side with respect to the first surface 22. The second surface 24 of the resin insulating layer 20 faces the first conductor layer 10. The resin insulating layer 20 has an opening 26 that exposes the pad 14. The resin insulating layer 20 is formed of a resin 80 and a large number of inorganic particles 90 dispersed in the resin 80. The resin 80 is an epoxy resin. Examples of the resin include a thermosetting resin and a photocurable resin. The inorganic particles 90 are, for example, glass particles. The inorganic particles 90 may be alumina particles.

As illustrated in FIGS. 1 and 2, the inorganic particles 90 include first inorganic particles 91 forming an inner wall surface 27 of the opening 26 and second inorganic particles 92 embedded in the resin 80. The second inorganic particles 92 each have a spherical shape. The first inorganic particles 91 each have a shape obtained by cutting a sphere along a flat surface. The first inorganic particles 91 each have a shape obtained by cutting a second inorganic particle 92 along a flat surface. The first inorganic particles 91 and the second inorganic particles 92 are different in shape.

The first surface 22 of the resin insulating layer 20 is formed only of the resin 80. No inorganic particles 90 (second inorganic particles 92) are exposed from the first surface 22. The first surface 22 does not include surfaces of the second inorganic particles 92. No unevenness is formed on the first surface 22 of the resin insulating layer 20. The first surface 22 is not roughened. The first surface 22 is formed smooth. The first surface 22 has an arithmetic mean roughness (Ra) of 0.02 μm or more and 0.06 μm or less.

Figure 3:
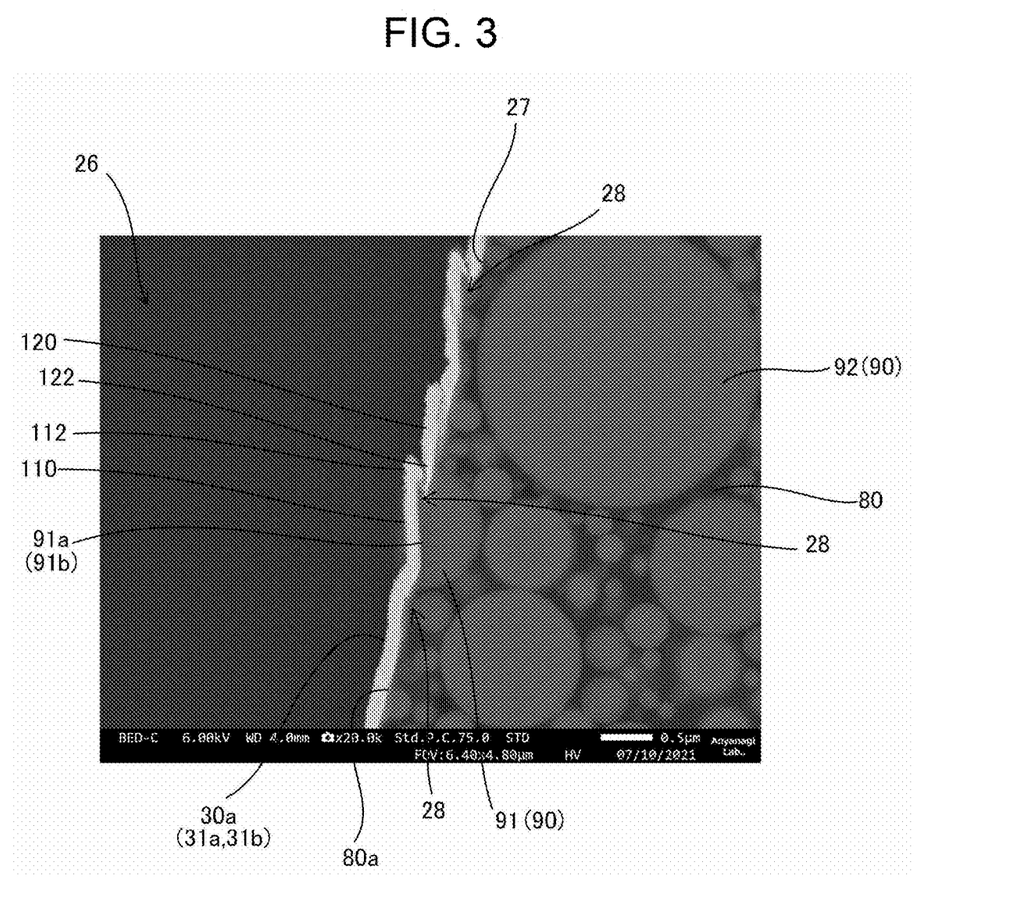
FIG. 3 is a cross-sectional photograph schematically showing a part of a printed wiring board according to an embodiment of the present invention.

FIG. 3 is a cross-sectional photograph showing an example of the inner wall surface 27 of the opening 26 and a seed layer (30a). As shown in FIGS. 2 and 3, the inner wall surface 27 of the opening 26 is formed of the resin 80 and the first inorganic particles 91. The first inorganic particles 91 each have a flat part (91a). The flat parts (91a) form the inner wall surface 27. The inner wall surface 27 is formed of the resin 80 and the flat parts (91a). The flat parts (93a) and a surface (80a) of the resin 80 that forms the inner wall surface 27 form a substantially common surface. No unevenness is formed on the resin 80 that forms the inner wall surface 27. The surface (80a) of the resin 80 that forms the inner wall surface 27 is smooth. No unevenness is formed on exposed surfaces (91b) of the flat parts (91a) (surfaces that form the inner wall surface 27). The exposed surfaces (91b) of the flat parts (91a) are smooth. The inner wall surface 27 is formed smooth. Steps 28 are formed at boundary parts between the surface (80a) of the resin 80 and the flat parts (91a) of the first inorganic particles 91. Sizes of the steps 28 are preferably 3.0 μm or less, more preferably 1.5 μm or less, and even more preferably 0.5 μm or less. The steps 28 are formed between the exposed surfaces (91b) and the surface (80a) of the resin 80. The sizes of the steps 28 are substantially the same as distances from the exposed surfaces (91b) to the surface (80a) of the resin 80. The exposed surfaces (91b) are recessed with respect to the surface (80a) of the resin 80. Or, the surface (80a) of the resin 80 is recessed with respect to the exposed surfaces (91b). The latter is preferable.

The flat parts (91a) of the first inorganic particles 91 substantially match a surface obtained by extending a surface (80a) of the resin 80 formed around the first inorganic particles 91 (a surface that forms the inner wall surface 27). The flat parts (91a) drawn with substantially straight lines in FIG. 2 each mean a flat surface. In the cross section illustrated in FIG. 2, the flat parts (91a) are each a flat surface. It is also possible that the flat parts (91a) are not each a perfect flat surface. The flat parts (91a) are each substantially a flat surface and are each substantially a smooth surface.

Figure 4:
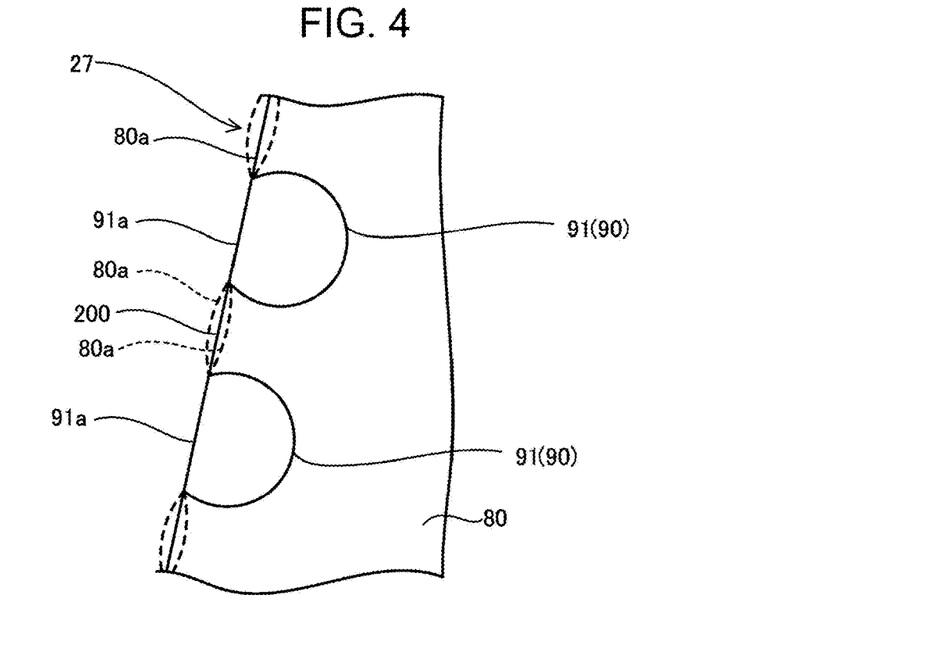
FIG. 4 is an enlarged cross-sectional view schematically illustrating a part of an inner wall surface.

FIG. 4 is an enlarged cross-sectional view illustrating a part of the inner wall surface 27 in FIG. 2. As illustrated in FIG. 4, with respect to a reference surface 200 connecting the flat parts (91a) of two first inorganic particles 91 forming the inner wall surface 27, the surface (80a) of the resin 80 positioned between the two first inorganic particles 91 may be concave or convex (see broken lines). Preferably, there are no other first inorganic particles 91 between the two first inorganic particles 91 that form the reference surface 200. A distance between the reference surface 200 and the surface (80a) of the resin 80 may be used as a representative value of the sizes of the steps 28.

As illustrated in FIG. 2, the inner wall surface 27 of the opening 26 is inclined. An angle (inclination angle) (θ) between the inner wall surface 27 and an upper surface of the pad 14 is 70 degrees or more and 90 degrees or less.

In the cross-sections illustrated in FIGS. 1 and 2, the opening 26 is illustrated to have a substantially inverted trapezoidal shape. However, the opening 26 has actually a substantially inverted truncated cone shape. Therefore, the inner wall surface (side wall) 27 of the opening 26 is actually a substantially curved surface. That is, the common surface formed by the flat parts (91a) and the resin 80 includes the inner wall surface (side wall) 27 formed as a substantially curved surface.

As illustrated in FIG. 1, the second conductor layer 30 is formed on the first surface 22 of the resin insulating layer 20. The second conductor layer 30 includes a first signal wiring 32, a second signal wiring 34, and a land 36. Although not illustrated in the drawing, the second conductor layer 30 also includes conductor circuits other than the first signal wiring 32, the second signal wiring 34, and the land 36. The first signal wiring 32 and the second signal wiring 34 form a pair wiring. The second conductor layer 30 is mainly formed of copper. The second conductor layer 30 is formed by the seed layer (30a) on the first surface 22 and an electrolytic plating layer (30b) on the seed layer (30a). The seed layer (30a) is formed by sputtering. The seed layer (30a) is formed of a first layer (31a) on the first surface 22 and a second layer (31b) on the first layer (31a). The first layer (31a) is in contact with the first surface 22. The second layer (31b) is not essential.

The first layer (31a) that forms the second conductor layer 30 is similar to the first layer (11a) that forms the first conductor layer 10. The second layer (31b) that forms the second conductor layer 30 is similar to the second layer (11b) that forms the first conductor layer 10. The electrolytic plating layer (30b) that forms the second conductor layer 30 is similar to the electrolytic plating layer (10b) that forms the first conductor layer 10.

The via conductor 40 is formed in the opening 26. The via conductor 40 electrically connects the first conductor layer 10 and the second conductor layer 30. In FIG. 1, the via conductor 40 electrically connects the pad 14 and the land 36. The via conductor 40 is formed of a seed layer (30a) and an electrolytic plating layer (30b) on the seed layer (30a). The seed layer (30a) that forms the via conductor 40 and the seed layer (30a) that forms the second conductor layer 30 are common. The electrolytic plating layer (30b) that forms the via conductor 40 and the electrolytic plating layer (30b) that forms the second conductor layer 30 are common. The seed layer (30a) that forms the via conductor 40 is formed of a first layer (31a), which is formed on the inner wall surface 27 of the opening 26 and on the pad 14 exposed from the opening 26, and a second layer (31b) on the first layer (31a). The first layer (31a) is in contact with the upper surface of the pad 14 and the inner wall surface 27.

As illustrated in FIGS. 1 and 2, the seed layer (30a) has a first portion (P1) on the first surface 22, a second portion (P2) on the inner wall surface 27 of the opening 26, and a third portion (P3) on the pad 14 exposed from the opening 26. The seed layer (30a) that forms the third portion (P3) closes a bottom opening of the opening 26. The first layer (31a) that forms the third portion (P3) closes the bottom opening of the opening 26. The bottom opening is positioned on the upper surface of the pad 14.

Figure 5:
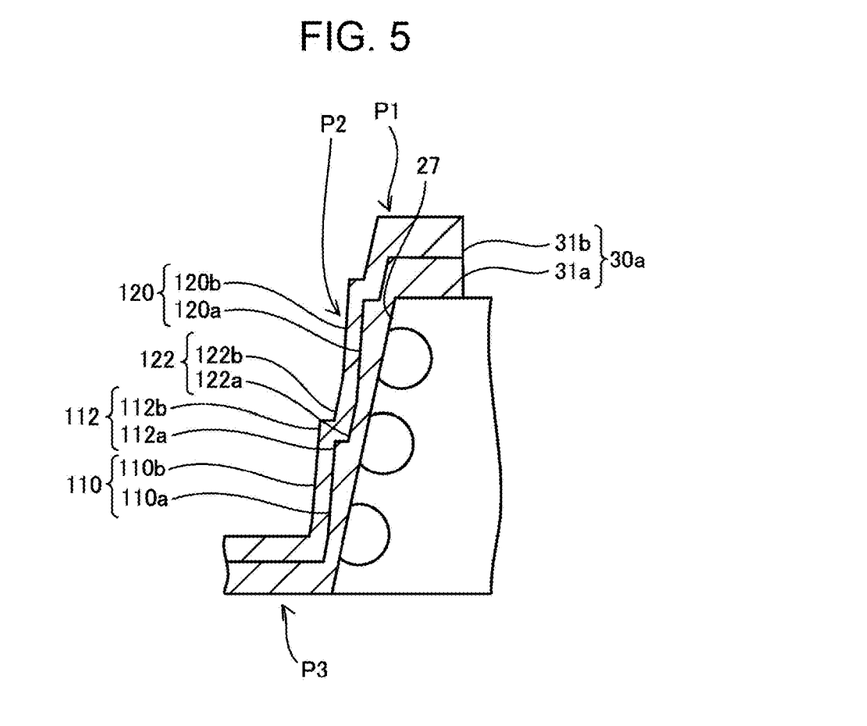
FIG. 5 is an enlarged cross-sectional view schematically illustrating a part of a seed layer.

FIG. 5 is an enlarged cross-sectional view schematically illustrating a part of the seed layer (30a) (the second portion (P2)) on the inner wall surface 27 of FIG. 2. The second portion (P2) of the seed layer (30a) is in contact with the inner wall surface 27. As shown in FIGS. 2, 3 and 5, the second portion (P2) has a substantially smooth first film 110 and a substantially smooth second film 120. The first film 110 and the second film 120 are electrically connected to each other. The first film 110 and the second film 120 are continuous. As shown in FIG. 3, a part of the first film 110 is formed on the second film 120. A leading end 112 of the first film 110 is formed on a trailing end 122 of the second film 120. The first film 110 and the second film 120 are formed at the same time. The second portion (P2) has a substantially step-shaped cross section.

As illustrated in FIG. 5, the first layer (31a) of the second portion (P2) has a first film (110a) and a second film (120a). The first film (110a) and the second film (120a) are electrically connected to each other. The first film (110a) and the second film (120a) are continuous. The first film (110a) and the second film (120a) are formed at the same time. A leading end (112a) of the first film (110a) is formed on a trailing end (122a) of the second film (120a). The first layer (31a) covering the inner wall surface 27 has a substantially step-shaped cross section. The first layer (31a) on the inner wall surface 27 is in contact with the inner wall surface 27.

The second layer (31b) of the second portion (P2) has a first film (110b) and a second film (120b). The first film (110b) and the second film (120b) are electrically connected to each other. The first film (110b) and the second film (120b) are formed at the same time. A leading end (112b) of the first film (110b) is formed on a trailing end (122b) of the second film (120b). The second layer (31b) formed on the inner wall surface 27 has a substantially step-shaped cross section.

In the embodiment, a part of the first film 110 is laminated on the second film 120. A part of the first film 110 overlaps the second film 120. The leading end 112 of the first film 110 is laminated on the trailing end 122 of the second film 120. The leading end 112 of the first film 110 overlaps the trailing end 122 of the second film 120.

The inner wall surface 27 of the embodiment is formed as a substantially smooth surface. When the first layer (31a) follows the shape of the inner wall surface 27, the first layer (31a) on the inner wall surface 27 has a substantially smooth surface. The first layer (31a) has a linear cross-sectional shape. The seed layer (30a) on the inner wall surface 27 has a substantially smooth surface. The second portion (P2) has a linear cross-sectional shape. In this case, the electrolytic plating layer (30b) forming the via conductor 40 is formed on a smooth surface. For example, when the printed wiring board 2 is subjected to a large impact, peeling occurs between the first layer (31a) on the inner wall surface 27 and the second layer (31b) on the first layer (31a). Or, peeling occurs between the seed layer (30a) on the inner wall surface 27 and the electrolytic plating layer (30b) forming the via conductor 40. In contrast, the seed layer (30a) and the first layer (31a) in the embodiment each have a step-shaped cross section. Therefore, peeling is unlikely to occur.

Figure 6A:
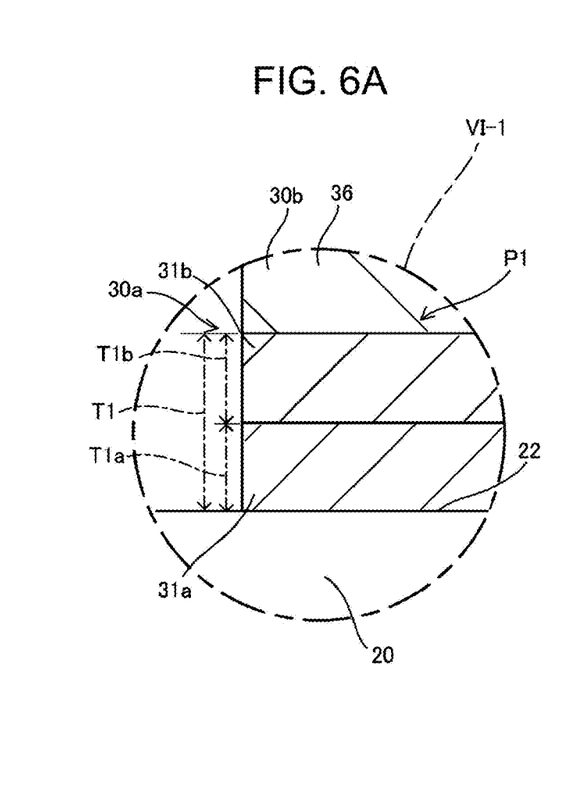
FIGS. 6A-6C are each an enlarged cross-sectional view schematically illustrating a part of the seed layer.
Figure 6B:
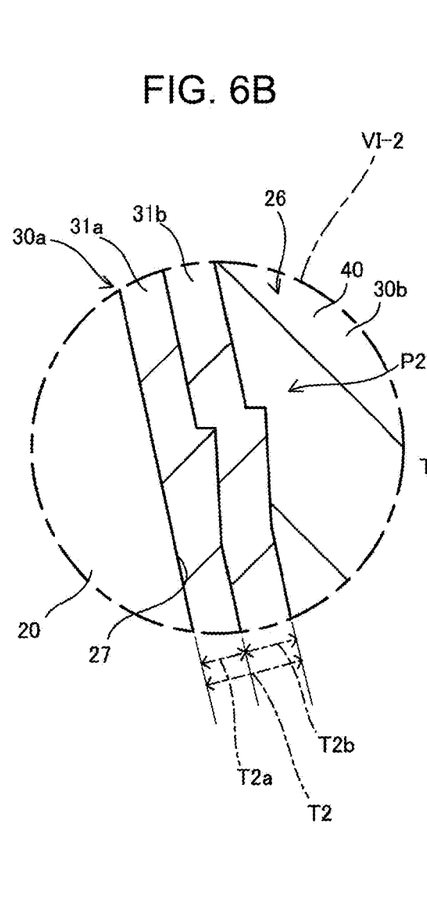
Figure 6C:
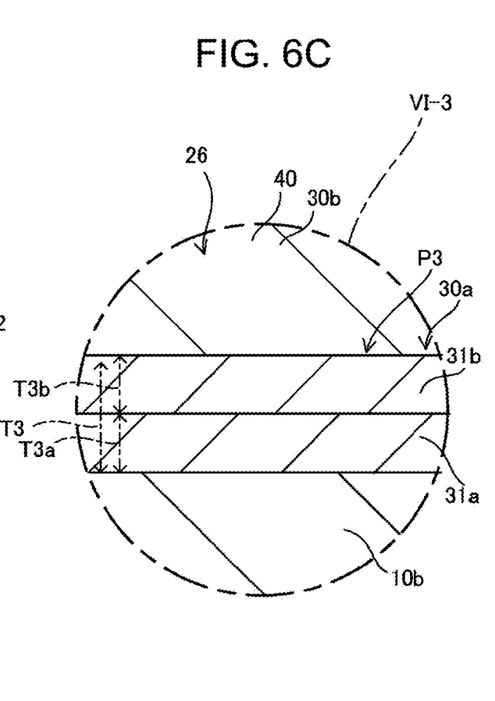

FIGS. 6A-6C are each an enlarged cross-sectional view illustrating a part of the seed layer (30a). FIG. 6A illustrates a portion (the first portion (P1)) indicated by a symbol (VI-1) in FIG. 2. FIG. 6B illustrates a portion (the second portion (P2)) indicated by a symbol (VI-2) in FIG. 2. FIG. 6C illustrates a portion (the third portion (P3)) indicated by a symbol (VI-3) in FIG. 2. As illustrated in FIGS. 6A-6C, a thickness (T1) of the first portion (P1) is larger than a thickness (T2) of the second portion (P2) and a thickness (T3) of the third portion (P3). Further, the thickness (T3) of the third portion (P3) is larger than the thickness (T2) of the second portion (P2).

When the seed layer (30a) is formed of multiple layers, the thickness (T1), the thickness (T2) and the thickness (T3) are each a total thickness of the layers. A thickness (T1a) of the first portion (P1) of the first layer (31a) is larger than a thickness (T2a) of the second portion (P2) of the first layer (31a) and a thickness (T3a) of the third portion (P3) of the first layer (31a). Further, the thickness (T3a) of the third portion (P3) of the first layer (31a) is larger than the thickness (T2a) of the second portion (P2) of the first layer (31a). Thicknesses of the other layers have similar relationships to those of the thicknesses of the first layer (31a). Therefore, when the seed layer (30a) is formed of two layers, a thickness (T1b) of the first portion (P1) of the second layer (31b) is larger than a thickness (T2b) of the second portion (P2) of the second layer (31b) and a thickness (T3b) of the third portion (P3) of the second layer (31b). Further, the thickness (T3b) of the third portion (P3) of the second layer (31b) is larger than the thickness (T2b) of the second portion (P2) of the second layer (31b).

A ratio of the thickness (T2) of the second portion (P2) to the thickness (T1) of the first portion (P1) ((the thickness (T2) of the second portion (P2))/(the thickness (T1) of the first portion (P1))) is 0.2 or more and 0.6 or less. A ratio of the thickness (T3) of the third portion (P3) to the thickness (T1) of the first portion (P1) ((the thickness (T3) of the third portion (P3))/(the thickness (T1) of the first portion (P1))) is 0.5 or more and 0.9 or less.

A thickness of the second layer (31b) is larger than a thickness of the first layer (31a). The thickness (T1b) is larger than the thickness (T1a). The thickness (T2b) is larger than the thickness (T2a). The thickness (T3b) is larger than the thickness (T3a).

When the seed layer (30a) is formed of only the first layer (31a), the thickness (T1a) of the first portion (P1) of the first layer (31a) is larger than the thickness (T2a) of the second portion (P2) of the first layer (31a) and the thickness (T3a) of the third portion (P3) of the first layer (31a). Further, the thickness (T3a) of the third portion (P3) of the first layer (31a) is larger than the thickness (T2a) of the second portion (P2) of the first layer (31a).

The thickness (T1) of the first portion (P1) of the seed layer (30a) is 0.02 μm or more and 1.0 μm or less. The thickness (T1a) of the first portion (P1) of the first layer (31a) is 0.01 μm or more and 0.5 μm or less. The thickness (T1b) of the first portion (P1) of the second layer (31b) is 0.01 μm or more and 0.9 μm or less. When the thickness (T1) of the first portion (P1) of the seed layer (30a) is less than 0.02 adhesion strength between the resin insulating layer 20 and the seed layer (30a) is low. When the thickness (T1) of the first portion (P1) exceeds 1.0 an etching amount for removing the seed layer (30a) is large. It is difficult to control a wiring width.

The thickness (T2) of the second portion (P2) of the seed layer (30a) is 0.004 or more and 0.6 μm or less. The thickness (T2a) of the second portion (P2) of the first layer (31a) is 0.002 μm or more and 0.3 μm or less. The thickness (T2b) of the second portion (P2) of the second layer (31b) is 0.002 μm or more and 0.54 μm or less.

The thickness (T3) of the third portion (P3) of the seed layer (30a) is 0.01 μm or more and 0.9 μm or less. The thickness (T3a) of the third portion (P3) of the first layer (31a) is 0.005 μm or more and 0.45 μm or less. The thickness (T3b) of the third portion (P3) of the second layer (31b) is 0.005 μm or more and 0.81 μm or less.

Although not illustrated in the drawings, each side of the printed wiring board 2 has a length of 50 mm or more. The length of each side is preferably 100 mm or more. The length of each side is 250 mm or less. A length of a signal wiring formed according to the embodiment is 5 mm or more. The length of the signal wiring may be 10 mm or more and 20 mm or less.

Method for Manufacturing Printed Wiring Board

Figure 7A:
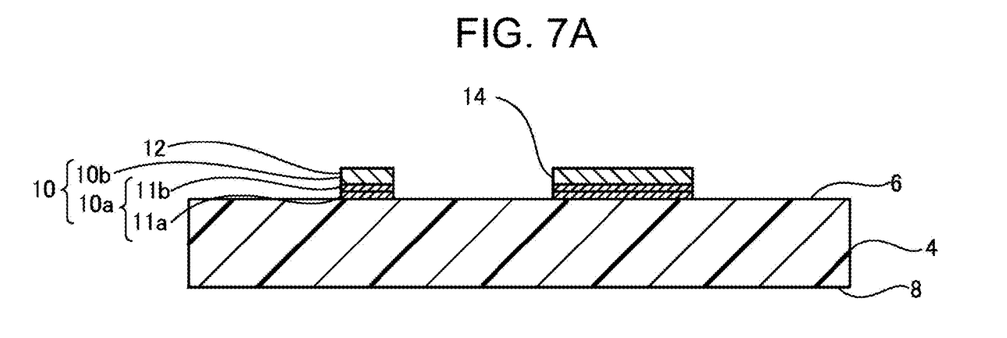
FIG. 7A is a cross-sectional view schematically illustrating a method for manufacturing a printed wiring board according to an embodiment of the present invention.
Figure 7B:
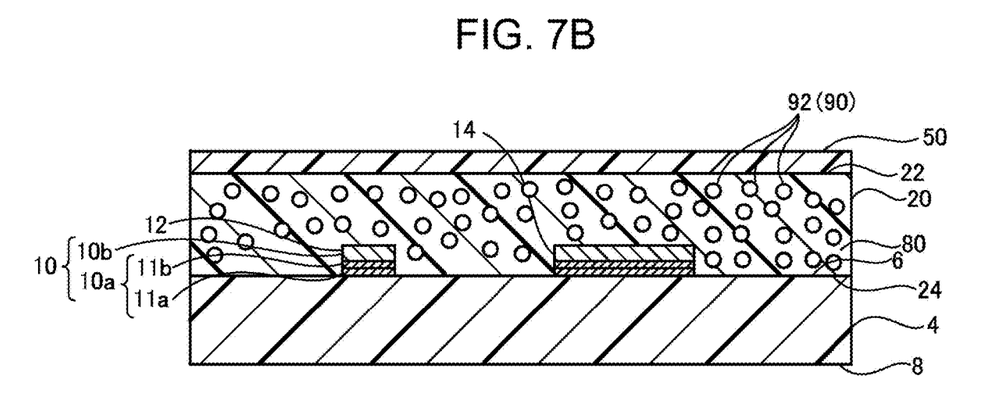
FIG. 7B is a cross-sectional view schematically illustrating a method for manufacturing a printed wiring board according to an embodiment of the present invention.
Figure 7C:
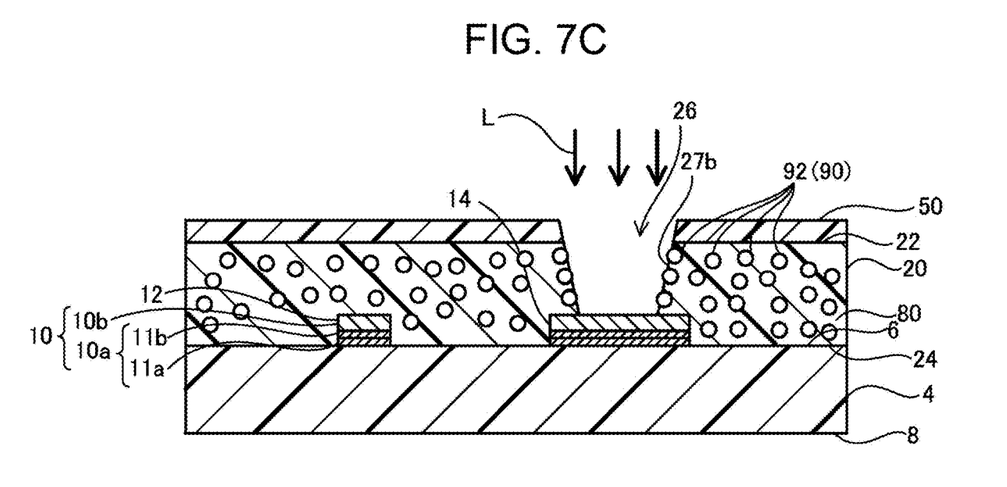
FIG. 7C is a cross-sectional view schematically illustrating a method for manufacturing a printed wiring board according to an embodiment of the present invention.
Figure 7D:
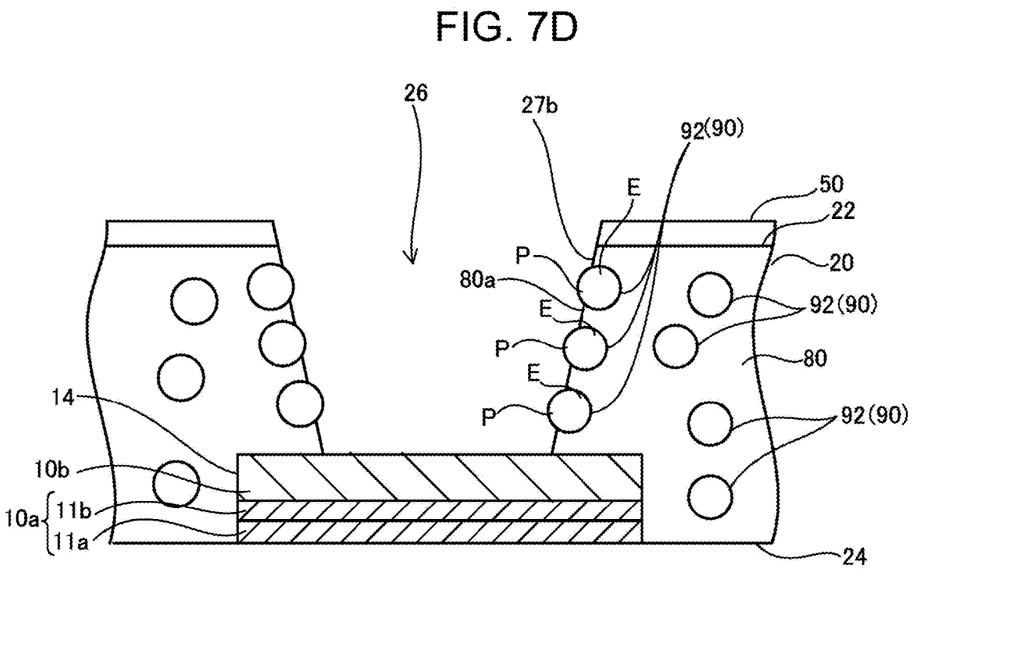
FIG. 7D is an enlarged cross-sectional view schematically illustrating a method for manufacturing a printed wiring board according to an embodiment of the present invention.
Figure 7E:
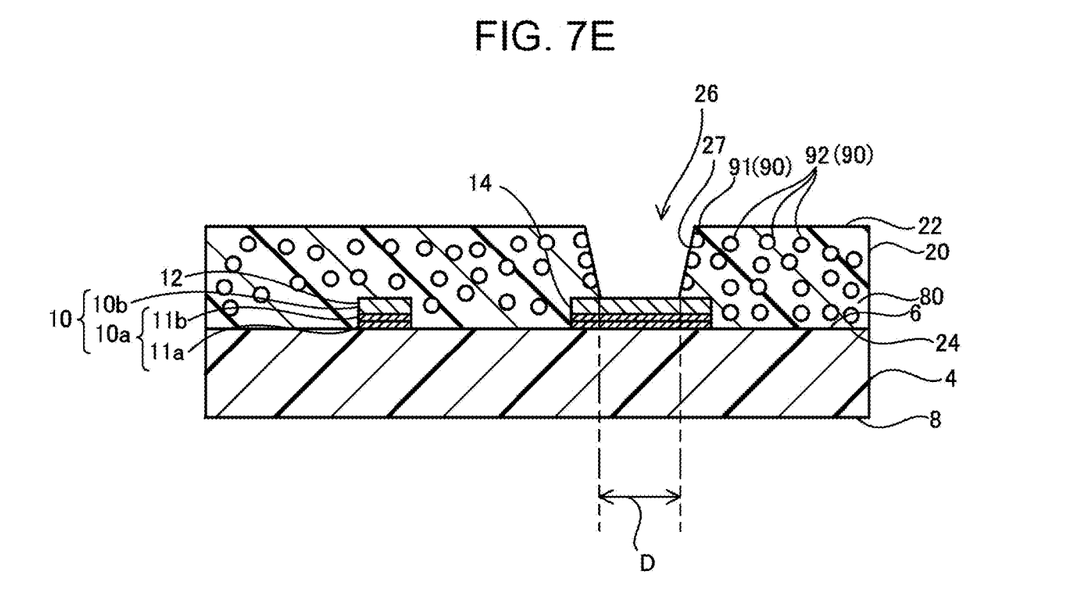
FIG. 7E is a cross-sectional view schematically illustrating a method for manufacturing a printed wiring board according to an embodiment of the present invention.
Figure 7F:
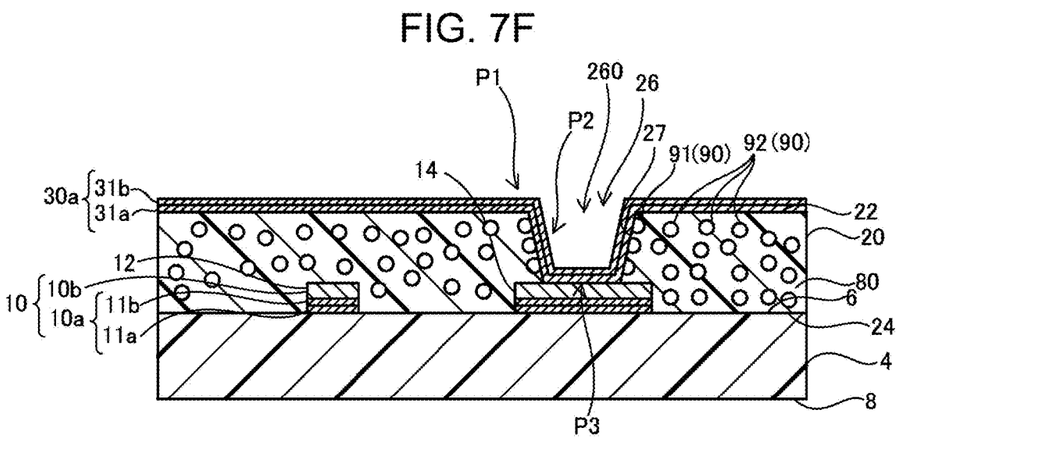
FIG. 7F is a cross-sectional view schematically illustrating a method for manufacturing a printed wiring board according to an embodiment of the present invention.
Figure 7G:
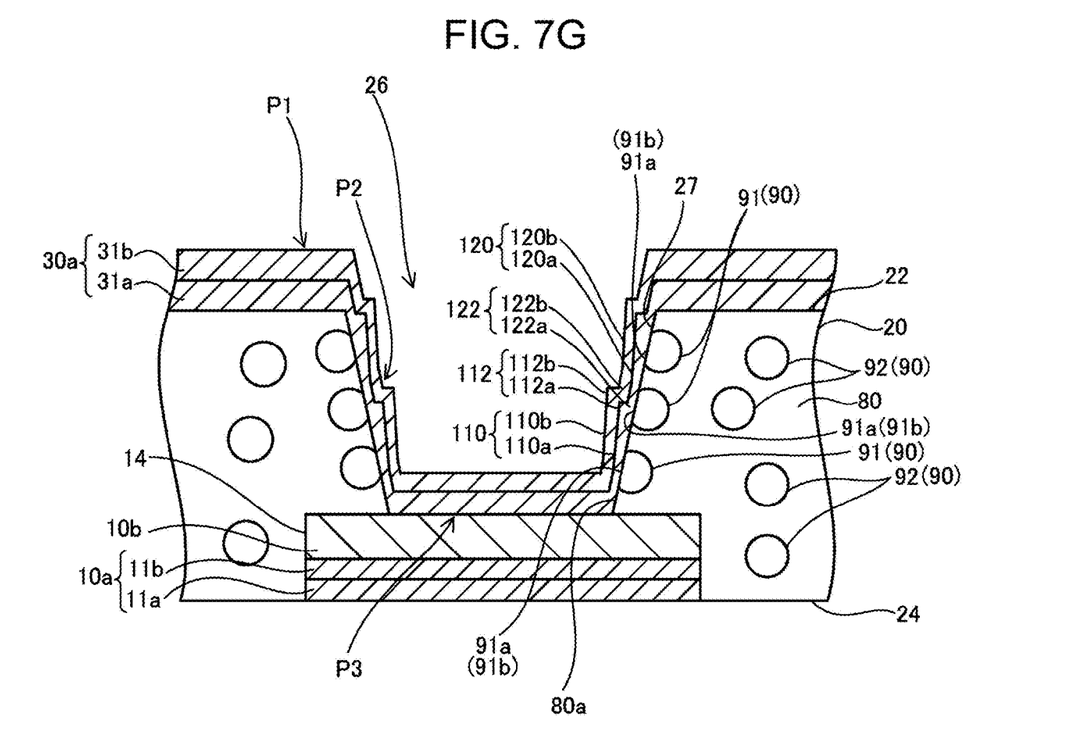
FIG. 7G is an enlarged cross-sectional view schematically illustrating a method for manufacturing a printed wiring board according to an embodiment of the present invention.

FIGS. 7A-7G illustrate a method for manufacturing the printed wiring board 2 according to an embodiment of the present invention. FIGS. 7A-7C and 7E-7F are cross-sectional views. FIGS. 7D and 7G are enlarged cross-sectional views. FIG. 7A illustrates the insulating layer 4 and the first conductor layer 10 formed on the third surface 6 of the insulating layer 4. The first conductor layer 10 is formed using a semi-additive method. The first layer (11a) and the second layer (11b) are formed by sputtering. The first layer (11a) is formed of an alloy containing copper, aluminum, and a specific metal. An example of a specific metal is silicon or nickel. The second layer (11b) is formed of copper. The electrolytic plating layer (10b) is formed by electrolytic plating. The electrolytic plating layer (10b) is formed of copper.

As illustrated in FIG. 7B, the resin insulating layer 20 and a protective film 50 are formed on the insulating layer 4 and the first conductor layer 10. The second surface 24 of the resin insulating layer 20 faces the third surface 6 of the insulating layer 4. The protective film 50 is formed on the first surface 22 of the resin insulating layer 20. The resin insulating layer 20 has the resin 80 and the inorganic particles 90 (the second inorganic particles 92). The inorganic particles 90 are embedded in the resin 80.

The protective film 50 completely covers the first surface 22 of the resin insulating layer 20. An example of the protective film 50 is a film formed of polyethylene terephthalate (PET). A release agent is formed between the protective film 50 and the resin insulating layer 20.

As illustrated in FIG. 7C, laser (L) is irradiated from above the protective film 50. The laser (L) penetrates the protective film 50 and the resin insulating layer 20 at the same time. The opening 26 for a via conductor reaching the pad 14 of the first conductor layer 10 is formed. The laser (L) is, for example, UV laser, or CO2 laser. The pad 14 is exposed from the opening 26. When the opening 26 is formed, the first surface 22 is covered by the protective film 50. Therefore, when the opening 26 is formed, even when the resin scatters, adherence of the resin to the first surface 22 is suppressed.

FIG. 7D illustrates an inner wall surface (27b) of the opening 26 after the laser irradiation. The inner wall surface (27b) is formed of the resin 80 and the inorganic particles 90 protruding from the resin 80. In order to control a shape of the inner wall surface, the inner wall surface (27b) after the laser irradiation is treated. It is preferable to selectively remove the inorganic particles 90 protruding from the resin

80. As a result, the first inorganic particles 91 are formed from the inorganic particles 90. For example, the inorganic particles 90 protruding from the resin 80 are selectively removed by treating the inner wall surface (27*b*) after the laser irradiation with a chemical. Or, the inorganic particles 90 protruding from the resin 80 are selectively removed by treating the inner wall surface (27*b*) after the laser irradiation with plasma. The selectively removing includes that an etching rate of the inorganic particles 90 is greater than an etching rate of the resin 80. For example, a difference in etching rate between the two is 10 or more times. Or, the difference in etching rate between the two is 50 or more times. Or, the difference in etching rate between the two is 100 or more times. By treating the inner wall surface (27*b*) after the laser irradiation, the first inorganic particles 91 having the flat parts (91*a*) (see FIG. 2) are obtained. By controlling conditions for treating the inner wall surface (27*b*) after the laser irradiation, the shape of the inner wall surface (27*b*) can be controlled. Examples of the conditions are a temperature, a concentration, a time, a type of gas, and a pressure. The etching rate of the inorganic particles 90 and the etching rate of the resin are controlled.

By irradiating the resin insulating layer 20 with the laser (L), some of the second inorganic particles 92 embedded in the resin 80 form the inner wall surface (27*b*) after the laser irradiation. The second inorganic particles 92 forming the inner wall surface (27*b*) after the laser irradiation are each formed of a protruding portion (P) protruding from the resin 80 and a portion (E) embedded in the resin 80. The inner wall surface (27*b*) after the laser irradiation is treated. For example, the inner wall surface (27*b*) is treated with plasma of a gas containing tetrafluoromethane. The protruding portions (P) are selectively removed to form the inner wall surface 27 (FIGS. 1 and 2) of the embodiment. The first inorganic particles 91 are formed from the second inorganic particles 92. By selectively removing the protruding portions (P), the first inorganic particles 91 having the flat parts (91*a*) are formed. The flat parts (91*a*) are flat surfaces. When the second inorganic particles 92 having spherical shapes are cut along a flat surface, the shapes of the first inorganic particles 91 are obtained. The inner wall surface 27 is formed of the flat parts (91*a*) and the surface (80*a*) of the resin 80, and the exposed surfaces (91*b*) of the flat parts (91*a*) and the surface (80*a*) of the resin 80 are substantially positioned on the same flat surface. For example, when the seed layer (30*a*) is formed on the inner wall surface (27*b*) by sputtering, the protruding portions (P) inhibit growth of a sputtering film (sputtering-deposited film). For example, a continuous seed layer (30*a*) is not formed on the inner wall surface (27*b*). Or the seed layer (30*a*) is increased in thickness. A fine conductor circuit cannot be formed. In the embodiment, the projecting portions (P) are removed. The seed layer (30*a*) formed by sputtering can be reduced in thickness. Even when the seed layer (30*a*) formed by sputtering is thin, a continuous seed layer (30*a*) can be obtained.

Forming the opening 26 includes forming the inorganic particles 90 (the second inorganic particles 92) having the protruding portions (P). The protruding portions (P) protrude from the resin 80 that forms the inner wall surface (27*b*) of the opening 26. The first inorganic particles 91 are formed by removing the protruding portions (P) of the inorganic particles 90 (the second inorganic particles 92). The inner wall surface 27 of the opening 26 includes the exposed surfaces (91*b*) of the first inorganic particles 91. The exposed surfaces (91*b*) of the first inorganic particles 91 are formed by removing the protruding portions (P).

Obtaining the shapes of the first inorganic particles 91 by cutting the second inorganic particles 92 having spherical shapes along a flat surface includes removing the protruding portions (P) of the inorganic particles 90. The inner wall surface 27 of the opening 26 is actually a substantially curved surface. Since the flat parts (91*a*) are formed by removing the protruding portions (P), the exposed surfaces (91*b*) of the flat parts (91*a*) each include a curved surface. That is, forming a common surface with the flat parts (91*a*) and the resin 80 includes forming the inner wall surface 27 formed with a substantially curved surface.

No unevenness is formed on the inner wall surface 27. The inner wall surface 27 is formed smooth. As shown in FIG. 3, the steps 28 are formed at the boundary parts between the surface (80*a*) of the resin 80 that forms the inner wall surface 27 and the flat parts (91*a*) of the first inorganic particles 91. Even when the steps 28 are formed, since the steps 28 are small, the exposed surfaces (91*b*) and the surface (80*a*) of the resin 80 form a substantially common surface. By controlling the conditions for treating the inner wall surface (27*b*) after the laser irradiation, a size of unevenness or the sizes of the steps 28 are controlled.

The inside of the opening 26 is cleaned. By cleaning the inside of the opening 26, resin residues generated when the opening 26 is formed are removed. The cleaning of the inside of the opening 26 is performed using plasma. That is, the cleaning is performed in a dry process. The cleaning includes a desmear treatment.

When the inside of the opening 26 is cleaned, the first surface 22 of the resin insulating layer 20 is covered by the protective film 50. The first surface 22 is not affected by the plasma. The first surface 22 is formed of the resin 80 only. No inorganic particles 90 are exposed from the first surface 22. The first surface 22 does not include surfaces of inorganic particles 90. The first surface 22 of the resin insulating layer 20 has no unevenness. The first surface 22 is formed smooth.

When treating the inner wall surface (27*b*) after the laser irradiation includes cleaning the inside of the opening 26, cleaning the inside of the opening 26 can be omitted.

As illustrated in FIG. 7E, after cleaning the inside of the opening 26, the protective film 50 is removed from the resin insulating layer 20. When treating the inner wall surface (27*b*) after the laser irradiation includes cleaning the inside of the opening 26, the protective film 50 is removed from the resin insulating layer 20 after treating the inner wall surface (27*b*) after the laser irradiation. When the inner wall surface (27*b*) after the laser irradiation is treated, the protective film 50 covers the first surface 22 of the resin insulating layer 20. After the protective film 50 is removed, no roughening of the first surface 22 of the resin insulating layer 20 is performed.

As illustrated in FIG. 7F, the seed layer (30*a*) is formed on the first surface 22 of the resin insulating layer 20. The seed layer (30*a*) is formed by sputtering. The formation of the seed layer (30*a*) is performed in a dry process. For example, sputtering is performed via a mask. First, a first mask covering the opening 26 for a via conductor is positioned on the resin insulating layer 20. The first mask exposes only the first surface 22 of the resin insulating layer 20. The first portion (P1) having the thickness (T1*a*) is formed on the first surface 22 of the resin insulating layer 20 via the first mask. The first mask is removed. A second mask exposing only the inner wall surface 27 of the opening 26 for a via conductor is positioned on the resin insulating layer 20. The second portion (P2) having the thickness (T2*a*) is formed on the inner wall surface 27 via the second mask. The second mask is removed. A third mask exposing only the pad 14 exposed from the opening 26 for a via conductor is positioned on the resin insulating layer 20. The third portion (P3) having the thickness (T3a) is formed on the pad 14 via the third mask. The third mask is removed. As a result, the first layer (31a) is formed on the first surface 22. The first layer (31a) is formed on the inner wall surface 27 and the pad 14, which are exposed from the opening 26. After that, the second layer (31b) is formed on the first layer (31a). A method for forming the first layer (31a) and a method for forming the second layer (31b) are the same. The first layer (31a) is formed of an alloy containing copper, aluminum, and a specific metal (for example, silicon). The second layer (31b) is formed of copper.

The first layer (31a) and the second layer (31b) are formed by sputtering. Examples of sputtering conditions are described below. A distance between a target and the first surface 22 of the resin insulating layer 20 is 50 mm or more and 250 mm or less. A voltage is 15 eV or more and 50 eV or less. A gas concentration is 0.1 Pa or more and 1.0 Pa or less. For example, by changing a processing time, the thickness (T1) of the first portion (P1) of the seed layer (30a), the thickness (T2) of the second portion (P2) of the seed layer (30a), and the thickness (T3) of the third portion (P3) of the seed layer (30a) can be adjusted. A thickness (T1a) of the first portion (P1) of the first layer (31a) is larger than a thickness (T2a) of the second portion (P2) of the first layer (31a) and a thickness (T3a) of the third portion (P3) of the first layer (31a). Further, the thickness (T3a) of the third portion (P3) of the first layer (31a) is larger than the thickness (T2a) of the second portion (P2) of the first layer (31a). The thickness (T1b) of the first portion (P1) of the second layer (31b) is larger than the thickness (T2b) of the second portion (P2) of the second layer (31b) and the thickness (T3b) of the third portion (P3) of the second layer (31b). Further, the thickness (T3b) of the third portion (P3) of the second layer (31b) is larger than the thickness (T2b) of the second portion (P2) of the second layer (31b). As a result, the thickness (T1) of the first portion (P1) of the seed layer (30a) is larger than the thickness (T2) of the second portion (P2) and the thickness (T3) of the third portion (P3). The thickness (T3) of the third portion (P3) of the seed layer (30a) is larger than the thickness (T2) of the second portion (P2).

A ratio of the thickness of the second layer (31b) to the thickness of the first layer (31a) ((the thickness of the second layer (31b))/(the thickness of the first layer (31a))) is 1.2 or more and 2 or less. A ratio ((the thickness (T1b))/(the thickness (T1a))), a ratio ((the thickness (T2b))/(the thickness (T2a))), and a ratio ((the thickness (T3b))/(the thickness (T3a))) are 1.2 or more and 2 or less.

The first portion (P1) is formed on the first surface 22 of the resin insulating layer 20, and the second portion (P2) is formed on the inner wall surface 27 of the resin insulating layer 20. The first portion (P1) and the second portion (P2) are both formed on the resin insulating layer 20. The first portion (P1) forms the seed layer (30a) of the land 36, the first signal wiring 32, and the second signal wiring 34. The second portion (P2) forms the seed layer (30a) of the via conductor 40. A thermal expansion coefficient of the resin insulating layer 20 and a thermal expansion coefficient of the seed layer (30a) are different from each other. Therefore, it is thought that, when the printed wiring board 2 receives a thermal shock, a stress acts on the seed layer (30a). Normally, the first signal wiring 32 and the second signal wiring 34 include portions that are bent considerably longer than the via conductor 40. Therefore, large stresses are expected to concentrate in the bent portions in the first signal wiring 32 and the second signal wiring 34. In contrast, the via conductor 40 is short and formed substantially straight. Therefore, concentration of a stress is unlikely to occur in the via conductor 40. Therefore, in order to avoid breakage of the seed layer (30a) on the first surface 22 of the resin insulating layer 20, the thickness of the seed layer (30a) forming the first signal wiring 32 and the second signal wiring 34 is preferably large. In contrast, the thickness of the seed layer (30a) on the inner wall surface 27 forming the via conductor 40 may be small. Therefore, in the embodiment, the thickness (T1) is larger than the thickness (T2).

By reducing the thickness (T2) of the second portion (P2), the time required to form the seed layer (30a) can be shortened.

The first layer (31a) of the seed layer (30a) is formed of an alloy containing copper, aluminum and silicon. Aluminum has high ductility and high malleability. Therefore, adhesion between resin insulating layer 20 and the first layer (31a) is high. It is thought that, even when the resin insulating layer 20 expands and contracts due to heat cycles, the seed layer (30a) containing aluminum can follow the expansion and contraction. Even when the first surface 22 is smooth, the seed layer (30a) is unlikely to peel off from the resin insulating layer 20. It is thought that aluminum is likely to be oxidized. It is thought that, when the first inorganic particles 91 are inorganic particles 90 containing oxygen, the first layer (31a) formed on the inner wall surface 27 of the opening 26 adheres to the first inorganic particles 91 via the oxygen in the inorganic particles 90 forming the inner wall surface 27. The first layer (31a) and the inner wall surface 27 are strongly bonded to each other. Adhesion between the inner wall surface 27 of the opening 26 and the first layer (31a) can be increased. The seed layer (30a) is unlikely to peel off from the inner wall surface 27. It is preferable that the inorganic particles 90 forming the inner wall surface 27 contain oxygen.

The first surface 22 is excellent in flatness. When the seed layer (30a) is formed on the first surface 22 by sputtering, a distance between a target and the first surface 22 is substantially constant. A seed layer (30a) (including the first portion (P1), the second portion (P2), and the third portion (P3)) with a substantially uniform thickness can be formed.

As illustrated in FIG. 7G, the first layer (31a) formed on the inner wall surface 27 has the first film (110a) and the second film (120a). The first film (110a) and the second film (120a) are formed at the same time. The first film (110a) and the second film (120a) are electrically connected to each other. A leading end (112a) of the first film (110a) is formed on a trailing end (122a) of the second film (120a). The first layer (31a) formed on the inner wall surface 27 has a substantially step-shaped cross section.

The second layer (31b) formed on the first layer (31a) covering the inner wall surface 27 has the first film (110b) and the second film (120b). The first film (110b) and the second film (120b) are formed at the same time. The first film (110b) and the second film (120b) are electrically connected to each other. A leading end (112b) of the first film (110b) is formed on a trailing end (122b) of the second film (120b). The second layer (31b) formed on the inner wall surface 27 has a substantially step-shaped cross section.

The inner wall surface 27 of the embodiment is formed of the surface (80a) of the resin 80 and the exposed surfaces (91b) of the first inorganic particles 91. These surfaces form a substantially common surface. The surface (80a) of the resin and the exposed surfaces (91b) are formed of different materials. And, the first layer (31a) is formed by sputtering. It is thought that growth of the first layer (31a) formed on the surface (80a) of the resin 80 and growth of the first layer (31a) formed on the exposed surfaces (91b) are different from each other. It is thought that growth of the seed layer (30a) formed on the surface (80a) of the resin 80 and growth of the seed layer (30a) formed on the exposed surfaces (91b) are different from each other. Therefore, in the embodiment, it is thought that the first film (110a) and the second film (120a) are formed on the inner wall surface 27. It is thought that the leading end (112a) of the first film (110a) is formed on the trailing end (122a) of the second film (120a). It is thought that the first layer (31a) on the inner wall surface 27 has a substantially step-shaped cross section. It is thought that the second layer (31b) on the inner wall surface 27 follows the first layer (31a). Therefore, it is thought that the second layer (31b) on the inner wall surface 27 has the first film (110b) and the second film (120b). It is thought that the leading end (112b) of the first film (110b) of the second layer (31b) is formed on the trailing end (122b) of the second film (120b) of the second layer (31b). It is thought that the second layer (31b) on the inner wall surface 27 has a substantially step-shaped cross section. Similarly, it is thought that the seed layer (30a) has the first film 110 and the second film 120. It is thought that the leading end 112 of the first film 110 of the seed layer (30a) is formed on the trailing end 122 of the second film 120 of the seed layer (30a). It is thought that the seed layer (30a) on the inner wall surface 27 has a substantially step-shaped cross section.

The first layer (31a) forming the second portion (P2) is formed of the first film (110a) and the second film (120a). The first layer (31a) forming the second portion (P2) has a substantially step-shaped cross section. The second layer (31b) forming the second portion (P2) is formed of the first film (110b) and the second film (120b). The second layer (31b) forming the second portion (P2) has a substantially step-shaped cross section. The seed layer (30a) forming the second portion (P2) is formed of the first film 110 and the second film 120. The seed layer (30a) forming the second portion (P2) has a substantially step-shaped cross section.

The first layer (31a) on the inner wall surface 27 is formed on the substantially smooth inner wall surface 27. Therefore, in the embodiment, a surface of the first film (110a) of the first layer (31a) and a surface of the second film (120a) of the first layer (31a) can be formed substantially smooth. Similarly, a surface of the first film (110b) of the second layer (31b) and a surface of the second film (120b) of the second layer (31b) can be formed substantially smooth. A surface of the first film 110 of the second portion (P2) and a surface of the second film 120 of the second portion (P2) can be formed substantially smooth. When the surfaces are smooth, transmission loss can be reduced.

When the inner wall surface 27 has the steps 28 shown in FIG. 3, the first layer (31a) having the first film (110a) and the second film (120a) can be easily formed by sputtering. The seed layer (30a) having the first film 110 and the second film 120 can be easily formed. The leading end (112a) of the first film (110a) can be formed on the trailing end (122a) of the second film (120a). The leading end 112 of the first film 110 can be formed on the trailing end 122 of the second film 120. The first layer (31a) having a substantially stepped shape can be easily formed. The seed layer (30a) having a substantially stepped shape can be easily formed.

A plating resist is formed on the seed layer (30a). The plating resist has openings for forming the first signal wiring 32, the second signal wiring 34, and the land 36 (FIG. 1).

The electrolytic plating layer (30b) is formed on the seed layer (30a) exposed from the plating resist. The electrolytic plating layer (30b) is formed of copper. The electrolytic plating layer (30b) fills the opening 26. The first signal wiring 32, the second signal wiring 34, and the land 36 (FIG. 1) are formed by the seed layer (30a) and the electrolytic plating film (30b) on the first surface 22. The second conductor layer 30 is formed. The via conductor 40 (FIG. 1) is formed by the seed layer (30a) and the electrolytic plating film (30b) in the opening 26. The via conductor 40 connects the pad 14 and the land 36. The first signal wiring 32 and the second signal wiring 34 form a pair wiring.

An opening 260 for the via conductor 40 after the formation of the seed layer (30a) is illustrated in FIG. 7F. When the thickness (T2) is small, a volume of the opening 260 can be increased. Therefore, an electrolytic plating solution can easily enter the opening 260. A void is unlikely to form in the electrolytic plating layer (30b) that forms the via conductor 40. A via conductor 40 having a low resistance can be formed. Even when an opening diameter (D) of the opening 26 (a diameter on the pad 14) (see FIG. 7E) is 30 µm or less, a via conductor 40 that does not contain a void can be formed. Even when the opening diameter (D) is 10 µm or more and 25 µm or less, connection reliability via the via conductor 40 is stable for a long period of time. In this way, by reducing the thickness (T2) of the second portion (P2), cost, productivity and reliability can be improved. Therefore, the thickness (T2) is preferably smaller than thickness (T1).

The plating resist is removed. The seed layer (30a) exposed from the electrolytic plating layer (30b) is removed. The second conductor layer 30 and the via conductor 40 are formed at the same time. The printed wiring board 2 (FIG. 1) of the embodiment is obtained.

The electrolytic plating layer (10b) forming the pad 14 and the electrolytic plating layer (30b) forming the via conductor 40 sandwich the seed layer (30a) forming the third portion (P3). The seed layer (30a) is formed by sputtering. Since electrolytic plating and sputtering are different methods, it is thought that, when the printed wiring board 2 receives a thermal shock, a contraction amount or an expansion amount is different between the two. Therefore, the connection reliability via the via conductor 40 is likely to deteriorate between the seed layer (30a) and the electrolytic plating layer (10b) forming the pad 14. Or the connection reliability is likely to deteriorate between the seed layer (30a) and the electrolytic plating layer (30b) forming the via conductor 40. In order to reduce a degree of influence of the sputtered seed layer (30a) with respect to the connection reliability, the thickness of the sputtered seed layer (30a) on the pad 14 is preferably small. Therefore, in the embodiment, the thickness (T3) of the third portion (P3) is reduced. Specifically, in the embodiment, the thickness (T3) is smaller than the thickness (T1). As a result, even when the via conductor 40 is formed of the sputtered seed layer (30a) and the electrolytic plating layer (30b), a printed wiring board 2 with high connection reliability can be provided.

In the printed wiring board 2 of the embodiment, a part of the first film 110 forming the second portion (P2) is formed on the second film 120. The first film 110 and the second film 120 partially overlap. Therefore, strength of the second portion (P2) can be increased. The second portion (P2) is unlikely to break. The second portion (P2) is formed of the substantially smooth first film 110 and the substantially smooth second film 120. Therefore, transmission loss is low when high frequency signals are transmitted. Further, the thickness (T1) of the first portion (P1) of the seed layer (30a) is larger than the thickness (T2) of the second portion (P2) and the thickness (T3) of the third portion (P3). Therefore, the seed layer (30a) (the first portion (P1)) on the first surface 22 is unlikely to break. A high quality printed wiring board 2 is provided.

When a signal or power propagates from the pad 14 to the via conductor 40, the signal or power passes through the first layer (31a) of the seed layer (30a). Resistivity of aluminum contained in the alloy forming the first layer (31a) is higher than that of copper. Therefore, when a signal or power propagates in the first layer (31a), a distance of the propagation through the first layer (31a) is preferably short. In the embodiment, the thickness (T1a) of the first portion (P1) of the first layer (31a) is larger than the thickness (T2a) of the second portion (P2) and the thickness (T3a) of the third portion (P3). Therefore, when a signal or power propagates from the pad 14 to the via conductor 40, a distance of the propagation through the third portion (P3) of the first layer (31a) is short. Further, a signal or power is likely to directly propagates from the third portion (P3) of the seed layer (30a) to the electrolytic plating layer (30b). It is preferred that a signal or power propagates from the third portion (P3) to the electrolytic plating layer (30b) that forms the via conductor 40 without propagating from the third portion (P3) to the second portion (P2). In the embodiment, the thickness (T2) of the second portion (P2) is smaller than the thickness (T1) of the first portion (P1) and the thickness (T3) of the third portion (P3). Therefore, resistance of the second portion (P2) can be increased. Since a current flows through a portion with low resistance, a signal or power is likely to directly propagate from the third portion (P3) to the electrolytic plating layer (30b) that forms the via conductor 40. The seed layer (30a) is unlikely to adversely affect a signal transmission speed or power supply via the via conductors 40. Even when a logic IC is mounted on the printed wiring board 2, the logic IC is unlikely to malfunction.

The inner wall surface 27 of the opening 26 for the via conductor 40 is formed of the resin 80 and the exposed surfaces (91b) of the flat parts (91a) of the first inorganic particles 91. It is thought that, when the first layer (31a) is formed, particles that form a sputtering film (sputtering-deposited film) adhere to the first inorganic particles 91 of the inner wall surface 27. It is thought that particles that form a sputtering film are not embedded in the first inorganic particles 91. A thin and continuous seed layer (30a) can be formed on the inner wall surface 27. When the seed layer (30a) is removed, an etching amount is small. Therefore, an etching amount of the electrolytic plating layer (30b) is small. A signal wiring has a width as designed. A fine signal wiring can be formed. A high quality printed wiring board 2 is provided.

In the printed wiring board 2 of the embodiment, the first surface 22 of the resin insulating layer 20 is formed of resin only. No inorganic particles are exposed from the first surface 22. No unevenness is formed on the first surface 22. An increase in standard deviation of a relative permittivity in a portion near the first surface 22 of the resin insulating layer 20 is suppressed. The relative permittivity of the first surface 22 does not significantly vary depending on a location. Even when the first signal wiring 32 and the second signal wiring 34 are in contact with the first surface 22, a difference in propagation speed of an electric signal between the first signal wiring 32 and the second signal wiring 34 can be reduced. Therefore, in the printed wiring board 2 of the embodiment, noise is suppressed. Even when a logic IC is mounted on the printed wiring board 2 of the embodiment, data transmitted via the first signal wiring 32 and data transmitted via the second signal wiring 34 arrive at the logic IC substantially without delay. Malfunction of the logic IC can be suppressed. Even when a length of the first signal wiring 32 and a length of the second signal wiring 34 are 5 mm or more, a difference in propagation speed between the two can be reduced. Even when the length of the first signal wiring 32 and the length of the second signal wiring 34 are 10 mm or more and 20 mm or less, malfunction of the logic IC can be suppressed. A high-quality printed wiring board 2 is provided.

First Alternative Example

In the first alternative example according to an embodiment of the present invention, the specific metal contained in the alloy forming the first layers (11a, 31a) of the seed layers (10a, 30a) is at least one of nickel, zinc, gallium, silicon, and magnesium.

Second Alternative Example

In the second alternative example according to an embodiment of the present invention, the alloy forming the first layers (11a, 31a) of the seed layers (10a, 30a) does not contain carbon.

Third Alternative Example

In the third alternative example according to an embodiment of the present invention, the alloy forming the first layers (11a, 31a) of the seed layers (10a, 30a) does not contain oxygen.

In the present specification, the term "flat surface" is used with respect to the shape of the inner wall surface, the shapes of the flat parts (91a), and the shapes of the first inorganic particles 91. The meaning of the "flat surface" used with respect to these is illustrated in FIGS. 1 and 2. That is, in FIGS. 1 and 2, the inner wall surface is drawn substantially straight. The shape of the inner wall surface in FIGS. 1 and 2 is substantially a straight line. The term "flat surface" in the present specification includes a substantially straight line illustrated in a cross section. As illustrated in the cross sections of the first inorganic particles 91 in FIGS. 1 and 2, in a cross section, cutting along a flat surface includes cutting along a straight line. The term "flat surface" in the present specification does not mean a perfect flat surface, but includes a substantially flat surface. A substantially flat surface may include small unevenness.

Japanese Patent Application Laid-Open Publication No. 2000-124602 describes a printed wiring board having a resin substrate, a resin insulating layer formed on the resin substrate, and a conductor circuit. The conductor circuit is formed on the resin insulating layer via an alloy layer containing a specific metal. For example, the specific metal is shown in Japanese Patent Application Laid-Open Publication No. 2000-124602.

In the printed wiring board having the alloy layer of Japanese Patent Application Laid-Open Publication No. 2000-124602, it is thought that adhesion between the conductor circuit and the resin insulating layer is insufficient.

A printed wiring board according to an embodiment of the present invention includes: a first conductor layer; a resin insulating layer that is formed on the first conductor layer, and has an opening for a via conductor exposing the first conductor layer, a first surface, and a second surface on the opposite side with respect to the first surface; a second conductor layer that is formed on the first surface of the resin insulating layer; and a via conductor that is formed in the opening and connects the first conductor layer and the second conductor layer. The second conductor layer and the via conductor are formed of a seed layer and an electrolytic plating layer formed on the seed layer. The seed layer has a first portion on the first surface, a second portion on an inner wall surface of the opening, and a third portion on the first conductor layer exposed from the opening. The first portion is thicker than the second portion and the third portion. The second portion has a substantially smooth first film and a substantially smooth second film. The first film and the second film are electrically connected to each other, and a part of the first film is formed on the second film.

In a printed wiring board according to an embodiment of the present invention, the second portion has a first film and a second film, and a part of the first film is formed on the second film. The first film and the second film partially overlap. Therefore, the seed layer (second portion) on the inner wall surface of the opening has high strength. The second portion is unlikely to disconnect. The second portion is formed of the substantially smooth first film and the substantially smooth second film. Therefore, transmission loss is low when high frequency signals are transmitted. Further, the thickness of the first portion is larger than the thickness of the second portion and the thickness of the third portion. Therefore, the seed layer (the first portion) on the first surface is unlikely to break. The thickness of the second portion is smaller than the thickness of the first portion. A volume of the opening for a via conductor after the formation of the seed layer can be increased. Even when a diameter of the opening for a via conductor is small, the opening for a via conductor can be filled with the electrolytic plating layer. The first conductor layer and the via conductor are connected via the third portion. The thickness of the third portion is smaller than the thickness of the first portion Influence of the third portion can be reduced. Connection resistance via the third portion is unlikely to increase. A high-quality printed wiring board is provided.

Obviously, numerous modifications and variations of the present invention are possible in light of the above teachings. It is therefore to be understood that within the scope of the appended claims, the invention may be practiced otherwise than as specifically described herein.

The invention claimed is:

1. A printed wiring board, comprising:
a first conductor layer;
a resin insulating layer formed on the first conductor layer having an opening;
a second conductor layer formed on a surface of the resin insulating layer and comprising a seed layer and an electrolytic plating layer formed on the seed layer; and
a via conductor formed in the opening of the resin insulating layer and comprising the seed layer and the electrolytic plating layer formed on the seed layer such that the via conductor is connecting the first conductor layer and the second conductor layer,
wherein the seed layer has a first portion formed on the surface of the resin insulating layer, a second portion formed on an inner wall surface in the opening of the resin insulating layer, and a third portion formed on a portion of the first conductor layer exposed by the opening of the resin insulating layer such that a thickness of the first portion is greater than a thickness of the second portion and a thickness of the third portion, that the second portion has a first film and a second film electrically connected to the first film and that a portion of the first film is formed on the second film.

2. The printed wiring board according to claim 1, wherein the seed layer is formed such that the first film of the second portion has a leading end formed on a trailing end of the second film.

3. The printed wiring board according to claim 2, wherein the seed layer is a layer comprising an alloy comprising copper, aluminum, and at least one element selected from nickel, zinc, gallium, silicon and magnesium.

4. The printed wiring board according to claim 1, wherein the seed layer is formed such that the first and second films of the second portion are formed in a same process.

5. The printed wiring board according to claim 1, wherein the seed layer is formed such that the second portion has a stepped-shaped cross section.

6. The printed wiring board according to claim 1, wherein the seed layer is formed such that the seed layer has a first layer and a second layer formed on the first layer and that the first layer has the first film and the second film.

7. The printed wiring board according to claim 6, wherein the seed layer is formed such that a leading end of the first film is formed on a trailing end of the second film.

8. The printed wiring board according to claim 6, wherein the seed layer is formed such that the first layer has a step-shaped cross section.

9. The printed wiring board according to claim 1, wherein the seed layer is formed such that the thickness of the third portion is greater than the thickness of the second portion.

10. The printed wiring board according to claim 1, wherein the seed layer is formed such that the seed layer has a first layer and a second layer formed on the first layer, that a thickness the first layer in the first portion is greater than a thickness of the first layer in the second portion and a thickness of the third portion of the first layer, and that the thickness of the first layer in the third portion is greater than the thickness of the first layer in the second portion.

11. The printed wiring board according to claim 10, wherein the seed layer is formed such that a thickness of the second layer in the first portion is greater than a thickness of the second layer in the second portion and a thickness of the second layer in the third portion and that the thickness of the second layer in the third portion is greater than the thickness of the second layer in the second portion.

12. The printed wiring board according to claim 9, wherein the seed layer is formed such that a ratio of the thickness of the second portion to the thickness of the first portion is in a range of 0.2 to 0.6 and that a ratio of the thickness of the third portion to the thickness of the first portion is in a range of 0.5 to 0.9.

13. The printed wiring board according to claim 1, wherein the seed layer is formed by sputtering.

14. The printed wiring board according to claim 1, wherein the seed layer is a layer comprising an alloy comprising copper, aluminum, and at least one element selected from nickel, zinc, gallium, silicon and magnesium.

15. The printed wiring board according to claim 14, wherein the at least one element includes silicon.

16. The printed wiring board according to claim 1, wherein the resin insulating layer includes resin and inorganic particles such that the inorganic particles include first inorganic particles forming the inner wall surface in the opening of the resin insulating layer and second inorganic particles embedded in the resin insulating layer and that shapes of the first inorganic particles are different from shapes of the second inorganic particles.

17. The printed wiring board according to claim 16, wherein the resin insulating layer is formed such that the inner wall surface has the resin and the first inorganic particles having flat parts forming the inner wall surface.

18. The printed wiring board according to claim 17, wherein the resin insulating layer is formed such that the inner wall surface has the flat parts of the first organic particles and a surface of the resin that form a common surface of the inner wall surface.

19. The printed wiring board according to claim 18, wherein the resin insulating layer is formed such that the inner wall surface has steps formed between the flat parts of the first organic particles and the surface of the resin.

20. A method for manufacturing a printed wiring board, comprising:
   forming an opening in a resin insulating layer formed on a first conductor layer such that the opening exposes a portion of the first conductor layer;
   forming, on a surface of the resin insulating layer, a second conductor layer comprising a seed layer and an electrolytic plating layer formed on the seed layer; and
   forming, in the opening of the resin insulating layer, a via conductor comprising the seed layer and the electrolytic plating layer formed on the seed layer such that the via conductor is connecting the first conductor layer and the second conductor layer,
   wherein the seed layer has a first portion formed on the surface of the resin insulating layer, a second portion formed on an inner wall surface in the opening of the resin insulating layer, and a third portion formed on a portion of the first conductor layer exposed by the opening of the resin insulating layer such that a thickness of the first portion is greater than a thickness of the second portion and a thickness of the third portion, the resin insulating layer includes resin and inorganic particles such that the inorganic particles comprising first inorganic particles forming the inner wall surface and second inorganic particles embedded in the resin insulating layer and that the first inorganic particles have shapes that are different from shapes of the second inorganic particles, the forming of the opening includes forming a group of the second inorganic particles having protruding portions protruding from the inner wall surface in the opening of the resin insulating layer, and removing the protruding portions in the group of the second inorganic particles such that the first inorganic particles having flat parts are formed on the inner wall surface of the resin insulating layer.

* * * * *